US010276379B2

(12) United States Patent
Cheng et al.

(10) Patent No.: US 10,276,379 B2
(45) Date of Patent: Apr. 30, 2019

(54) TREATMENT APPROACH TO IMPROVE FILM ROUGHNESS BY IMPROVING NUCLEATION/ADHESION OF SILICON OXIDE

(71) Applicant: Applied Materials, Inc., Santa Clara, CA (US)

(72) Inventors: Rui Cheng, San Jose, CA (US); Abhijit Basu Mallick, Fremont, CA (US); Yihong Chen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/925,976

(22) Filed: Mar. 20, 2018

(65) Prior Publication Data

US 2018/0294157 A1 Oct. 11, 2018

Related U.S. Application Data

(60) Provisional application No. 62/482,872, filed on Apr. 7, 2017.

(51) Int. Cl.
*H01L 21/033* (2006.01)
*H01L 21/02* (2006.01)
(Continued)

(52) U.S. Cl.
CPC .......... *H01L 21/0337* (2013.01); *C23C 16/24* (2013.01); *C23C 16/50* (2013.01);
(Continued)

(58) Field of Classification Search
CPC ............. H01L 21/0337; H01L 21/0273; H01L 21/02164; H01L 21/02658;
(Continued)

(56) References Cited

U.S. PATENT DOCUMENTS 5,389,570 A 2/1995 Shiozawa
6,852,635 B2 2/2005 Satta et al.
(Continued)

FOREIGN PATENT DOCUMENTS

WO 2007103343 A1 9/2007

OTHER PUBLICATIONS

International Search Report and Written Opinion dated Jul. 2, 2018 for Application No. PCT/US2018/023474.

*Primary Examiner* — Kyoung Lee
(74) *Attorney, Agent, or Firm* — Patterson + Sheridan LLP

(57) ABSTRACT

In one implementation, a method of forming an amorphous silicon layer on a substrate in a processing chamber is provided. The method comprises depositing a predetermined thickness of a sacrificial dielectric layer over a substrate. The method further comprises forming patterned features on the substrate by removing portions of the sacrificial dielectric layer to expose an upper surface of the substrate. The method further comprises performing a plasma treatment to the patterned features. The method further comprises depositing an amorphous silicon layer on the patterned features and the exposed upper surface of the substrate. The method further comprises selectively removing the amorphous silicon layer from an upper surface of the patterned features and the upper surface of the substrate using an anisotropic etching process to provide the patterned features filled within sidewall spacers formed from the amorphous silicon layer.

20 Claims, 6 Drawing Sheets

(51) Int. Cl.

| | |
|---|---|
| *H01L 21/3065* | (2006.01) |
| *H01L 21/027* | (2006.01) |
| *C23C 16/24* | (2006.01) |
| *C23C 16/50* | (2006.01) |
| *C23C 16/56* | (2006.01) |
| *H01L 21/311* | (2006.01) |
| *H01L 21/67* | (2006.01) |

(52) U.S. Cl.
CPC .......... *C23C 16/56* (2013.01); *H01L 21/0234* (2013.01); *H01L 21/0273* (2013.01); *H01L 21/02164* (2013.01); *H01L 21/02532* (2013.01); *H01L 21/02592* (2013.01); *H01L 21/02658* (2013.01); *H01L 21/02664* (2013.01); *H01L 21/0332* (2013.01); *H01L 21/3065* (2013.01); *H01L 21/31116* (2013.01); *H01L 21/67017* (2013.01); *H01L 21/67103* (2013.01); *H01L 21/67248* (2013.01)

(58) Field of Classification Search
CPC .......... H01L 21/02532; H01L 21/02592; H01L 21/3065; H01L 21/02664; H01L 21/0234; H01L 21/0332; H01L 21/31116; H01L 21/67103; H01L 21/67248; H01L 21/67017; C23C 16/24; C23C 16/50; C23C 16/56

See application file for complete search history.

(56) References Cited

U.S. PATENT DOCUMENTS

| | | | |
|---|---|---|---|
| 7,576,441 | B2 | 8/2009 | Yin et al. |
| 8,846,525 | B2 | 9/2014 | Rangarajan et al. |
| 8,993,454 | B2 | 3/2015 | Seamons et al. |
| 2003/0155074 | A1 | 8/2003 | Yao |
| 2007/0117359 | A1 | 5/2007 | Todd |
| 2008/0124925 | A1 | 5/2008 | Madan et al. |
| 2008/0138985 | A1 | 6/2008 | Madan et al. |
| 2008/0254619 | A1 | 10/2008 | Lin et al. |
| 2009/0035941 | A1 | 2/2009 | Park et al. |
| 2010/0075503 | A1 | 3/2010 | Bencher et al. |
| 2011/0097902 | A1 | 4/2011 | Singh et al. |
| 2011/0133313 | A1 | 6/2011 | Rangarajan et al. |
| 2011/0136340 | A1 | 6/2011 | Sim et al. |
| 2011/0244142 | A1 | 10/2011 | Cheng et al. |
| 2012/0202315 | A1 | 8/2012 | Whitesell, III et al. |
| 2013/0196078 | A1 | 8/2013 | Yudovsky et al. |
| 2014/0068962 | A1 | 3/2014 | Mori et al. |
| 2014/0113439 | A1 | 4/2014 | Patel et al. |
| 2014/0273529 | A1 | 9/2014 | Nguyen et al. |
| 2014/0349478 | A1 | 11/2014 | Koschinsky et al. |
| 2015/0235897 | A1 | 8/2015 | Fu et al. |
| 2015/0279676 | A1* | 10/2015 | Kim .................. H01L 21/02115 438/703 |
| 2016/0314960 | A1 | 10/2016 | Cheng et al. |
| 2017/0103893 | A1 | 4/2017 | Kulshreshtha et al. |
| 2017/0114453 | A1 | 4/2017 | Chen et al. |

* cited by examiner

TREATMENT APPROACH TO IMPROVE FILM ROUGHNESS BY IMPROVING NUCLEATION/ADHESION OF SILICON OXIDE

CROSS-REFERENCE TO RELATED APPLICATIONS

This application claims benefit of U.S. Provisional Patent Application Ser. No. 62/482,872, filed Apr. 7, 2017, which is incorporated herein by reference in its entirety.

BACKGROUND

Field

Implementations described herein generally relate to the fabrication of integrated circuits and particularly to the formation of spacers.

Description of the Related Art

Integrated circuits have evolved into complex devices that can include millions of transistors, capacitors and resistors on a single chip. The evolution of chip designs continually involves faster circuitry and greater circuit density. The demands for faster circuits with greater circuit densities impose corresponding demands on the materials used to fabricate such integrated circuits. In particular, as the dimensions of integrated circuit components are reduced to the sub-micron scale, it is now necessary to use low resistivity conductive materials as well as low dielectric constant insulating materials to obtain suitable electrical performance from such components. However, these low dielectric constant insulating materials often suffer from roughness issues, which increases roughness in subsequently deposited films and may affect adhesion between films.

Therefore, there is a need for improved methods of forming thin films with reduced roughness.

SUMMARY

Implementations described herein generally relate to the fabrication of integrated circuits and particularly to the formation of spacers. In one implementation, a method of forming an amorphous silicon layer on a substrate in a processing chamber is provided. The method comprises depositing a predetermined thickness of a sacrificial dielectric layer over a substrate. The method further comprises forming patterned features on the substrate by removing portions of the sacrificial dielectric layer to expose an upper surface of the substrate. The method further comprises performing a plasma treatment to the patterned features. The method further comprises depositing an amorphous silicon layer on the patterned features and the exposed upper surface of the substrate. The method further comprises selectively removing the amorphous silicon layer from an upper surface of the patterned features and the upper surface of the substrate using an anisotropic etching process to provide the patterned features filled within sidewall spacers formed from the amorphous silicon layer.

In another implementation, a method of forming an amorphous silicon layer on a substrate in a processing chamber is provided. The method comprises depositing a predetermined thickness of a sacrificial dielectric layer over a substrate. The method further comprises forming patterned features on the substrate by removing portions of the sacrificial dielectric layer to expose an upper surface of the substrate. The method further comprises forming a self-assembled monolayer ("SAM") on the patterned features. The method further comprises depositing an amorphous silicon layer on the SAM and the exposed upper surface of the substrate. The method further comprises selectively removing the amorphous silicon layer from an upper surface of the patterned features and the upper surface of the substrate using an anisotropic etching process to provide the patterned features filled within sidewall spacers formed from the amorphous silicon layer.

In yet another implementation, a method of forming an amorphous silicon layer on a substrate in a processing chamber is provided. The method comprises depositing a predetermined thickness of a sacrificial dielectric layer over a substrate. The method further comprises forming patterned features on the substrate by removing portions of the sacrificial dielectric layer to expose an upper surface of the substrate. The method further comprises performing a plasma treatment to the patterned features. The method further comprises forming a self-assembled monolayer ("SAM") on the plasma treated patterned features. The method further comprises depositing an amorphous silicon layer on the SAM and the exposed upper surface of the substrate. The method further comprises selectively removing the amorphous silicon layer from an upper surface of the patterned features and the upper surface of the substrate using an anisotropic etching process to provide the patterned features filled within sidewall spacers formed from the amorphous silicon layer.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
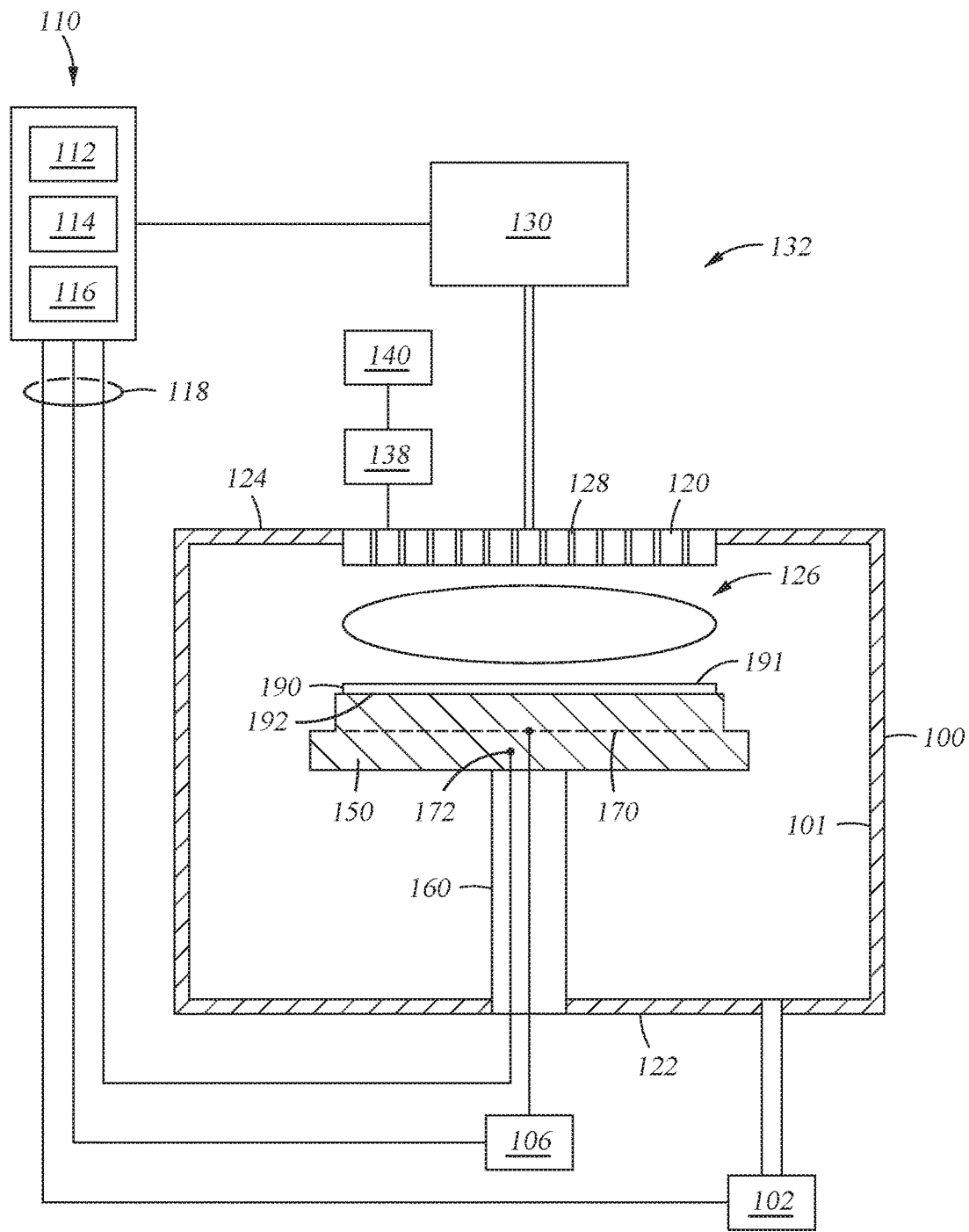
FIG. 1 depicts a schematic illustration of an apparatus that can be used for the practice of implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes films and techniques for deposition of spacer films on a substrate. Certain details are set forth in the following description and in FIGS. 1-6 to provide a thorough understanding of various implementations of the disclosure. Other details describing well-known structures and systems often associated with deposition and etching processes are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a thermal CVD and/or plasma-enhanced chemical vapor deposition (PECVD) process that can be carried out using any suitable thin film deposition system. Examples of suitable systems include the CENTURA® systems which may use a DxZ® processing chamber, PRECISION 5000® systems, PRODUCER® systems, PRODUCER® GT™ systems, PRODUCER® XP Precision™ systems and PRODUCER® SE™ systems which are commercially available from Applied Materials, Inc., of Santa Clara, Calif. Other tools capable of performing thermal CVD and PECVD processes may also be adapted to benefit from the implementations described herein. In addition, any system enabling the thermal CVD and/or PECVD processes described herein can be used to advantage. The apparatus description described herein is illustrative and should not be construed or interpreted as limiting the scope of the implementations described herein.

During the deposition of amorphous silicon films on oxide stacks, roughness and adhesion issues have been observed between the amorphous silicon film and the underlying oxide film. Some of the implementations described herein provided methods of treating the underlying oxide film prior to amorphous silicon deposition, which reduce roughness of the amorphous silicon film on oxide as well as improve the adhesion/nucleation between amorphous silicon and oxide stacks. In some implementations of the present disclosure in order to reduce roughness, the underlying oxide film was exposed to a plasma treatment and/or a self-assembled monolayer (SAM) treatment just before the deposition of the amorphous silicon film. Not to be bound by theory but it is believed that the plasma treatment process modifies dangling bonds present on the silicon oxide surface to reduce roughness and improve adhesion.

"Self-assembled monolayer" ("SAM") generally refers to a layer of molecules that are attached (e.g., by a chemical bond) to a surface and that have adopted a preferred orientation with respect to that surface and even with respect to each other. The SAM typically comprises an organized layer of amphiphilic molecules in which one end of the molecule, the "head group" shows a specific, reversible affinity for a substrate. Selection of the head group will depend on the application of the SAM, with the type of SAM compounds based on the substrate utilized. Generally, the head group is connected to an alkyl chain in which a tail or "terminal end" can be functionalized, for example, to vary wetting and interfacial properties. Self-assembled monolayers have been shown, with sufficient time, to cover surfaces so completely that the properties of that surface are changed. The molecules that form the SAM will selectively attach to one material over another material (e.g., silicon vs. dielectric) and if of sufficient density, can successfully block subsequent deposition allowing for selective deposition on materials not coated with the SAM.

FIG. 1 depicts a schematic illustration of a substrate processing system 132 that can be used to perform to perform the oxide treatment and subsequent amorphous silicon layer deposition in accordance with implementations described herein. Examples of suitable systems include the CENTURA® systems which may use a DxZ™ processing chamber, PRECISION 5000® systems, PRODUCER™ systems, PRODUCER GT™ and the PRODUCER SE™ processing chambers which are commercially available from Applied Materials, Inc., Santa Clara, Calif. It is contemplated that other processing system, including those available from other manufacturers, may be adapted to practice the implementations described herein.

The substrate processing system 132 includes a process chamber 100 coupled to a gas panel 130 and a controller 110. The process chamber 100 generally includes a top wall 124, a sidewall 101 and a bottom wall 122 that define a processing volume 126. A support pedestal 150 for supporting a substrate is provided in the processing volume 126 of the process chamber 100. The support pedestal 150 is supported by a stem 160 and may be typically fabricated from aluminum, ceramic, and other suitable materials. The support pedestal 150 may be moved in a vertical direction inside the process chamber 100 using a displacement mechanism (not shown).

The support pedestal 150 may include an embedded heating element 170 suitable for controlling the temperature of a substrate 190 supported on a surface 192 of the support pedestal 150. The support pedestal 150 may be resistively heated by applying an electric current from a power supply 106 to the embedded heating element 170. The embedded heating element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the embedded heating element 170, thereby maintaining the substrate 190 and the support pedestal 150 at a substantially constant temperature during film deposition. The supplied electric current may be adjusted to selectively control the temperature of the support pedestal 150 between about 100 degrees Celsius to about 700 degrees Celsius.

A temperature sensor 172, such as a thermocouple, may be embedded in the support pedestal 150 to monitor the temperature of the support pedestal 150 in a conventional manner. The measured temperature is used by the controller 110 to control the power supplied to the embedded heating element 170 to maintain the substrate at a desired temperature.

A vacuum pump 102 is coupled to a port formed in the bottom of the process chamber 100. The vacuum pump 102 is used to maintain a desired gas pressure in the process chamber 100. The vacuum pump 102 also evacuates post-processing gases and by-products of the process from the process chamber 100.

The substrate processing system 132 may further include additional equipment for controlling the chamber pressure, for example, valves (e.g. throttle valves and isolation valves) positioned between the process chamber 100 and the vacuum pump 102 to control the chamber pressure.

A showerhead 120 having a plurality of apertures 128 is disposed on the top of the process chamber 100 above the support pedestal 150. The apertures 128 of the showerhead 120 are utilized to introduce process gases into the process chamber 100. The apertures 128 may have different sizes, number, distributions, shape, design, and diameters to facilitate the flow of the various process gases for different process requirements. The showerhead 120 is connected to the gas panel 130 that allows various gases to supply to the processing volume 126 during processing. A plasma is formed from the process gas mixture exiting the showerhead 120 to enhance thermal decomposition of the process gases resulting in the deposition of material on a surface 191 of the substrate 190.

The showerhead 120 and support pedestal 150 may form a pair of spaced apart electrodes in the processing volume 126. One or more RF power sources 140 provide a bias potential through a matching network 138 to the showerhead 120 to facilitate generation of plasma between the showerhead 120 and the support pedestal 150. Alternatively, the RF power sources 140 and matching network 138 may be coupled to the showerhead 120, support pedestal 150, or coupled to both the showerhead 120 and the support pedestal 150, or coupled to an antenna (not shown) disposed exterior to the process chamber 100. In one implementation, the RF power sources 140 may provide between about 100 Watts and about 3,000 Watts at a frequency of about 50 kHz to about 13.6 MHz. In another implementation, the RF power sources 140 may provide between about 500 Watts and about 1,800 Watts at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general-purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the substrate processing system 132 are handled through numerous signal cables collectively referred to as signal buses 118, some of which are illustrated in FIG. 1.

In one implementation, the surface 191 of the substrate 190 is substantially planar. Alternatively, the substrate 190 may have patterned structures, a surface having trenches, holes, or vias formed therein. The substrate 190 may also have a substantially planar surface having a structure formed thereon or therein at a desired elevation. While the substrate 190 is illustrated as a single body, it is understood that the substrate 190 may contain one or more materials used in forming semiconductor devices such as metal contacts, trench isolations, gates, bitlines, or any other interconnect features. The substrate 190 may comprise one or more metal layers, one or more dielectric materials, semiconductor material, and combinations thereof utilized to fabricate semiconductor devices. For example, the substrate 190 may include an oxide material, a nitride material, a polysilicon material, or the like, depending upon application.

In one implementation where a memory application is desired, the substrate 190 may include the silicon substrate material, an oxide material, and a nitride material, with or without polysilicon sandwiched in between. In another implementation, the substrate 190 may include a plurality of alternating oxide and nitride materials (i.e., oxide-nitride-oxide (ONO)) deposited on a surface of the substrate (not shown). In various implementations, the substrate 190 may include a plurality of alternating oxide and nitride materials, one or more oxide or nitride materials, polysilicon or amorphous silicon materials, oxides alternating with amorphous carbon, oxides alternating with polysilicon, undoped silicon alternating with doped silicon, undoped polysilicon alternating with doped polysilicon, or undoped amorphous silicon alternating with doped amorphous silicon. The substrate may be any substrate or material surface upon which film processing is performed. For example, the substrate 190 may be a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof.

Figure 2:
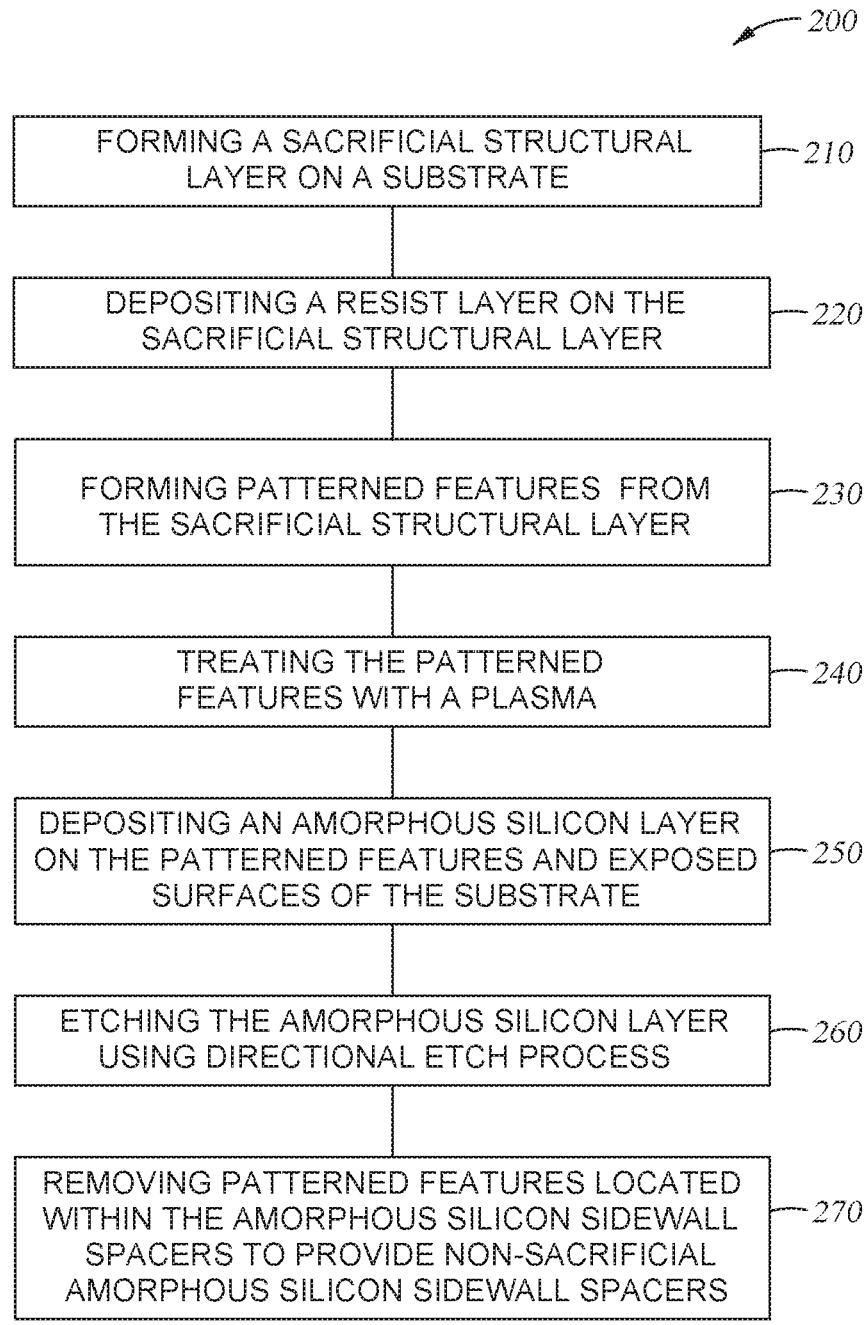
FIG. 2 is a process flow diagram depicting one implementation of a method for spacer formation with plasma treatment as described herein.

FIG. 2 is a process flow diagram depicting one implementation of a method 200 for spacer formation with plasma treatment as described herein. FIGS. 3A-3E are schematic side views of a structure formed according to the process of FIG. 2. The formation process can occur with or without plasma. The deposition can occur via a thermal CVD process or a PECVD process. It is contemplated that the self-aligned double patterning process is chosen for illustration purpose. The concepts of the present disclosure is equally applicable to other processes, for example, single or dual patterning scheme, such as via/hole shrink process, self-aligned triple patterning (SATP) process, or self-aligned quadruple patterning (SAQP) process, etc. that may involve the use of protective spacers with variable line width and spacing or protective sacrificial layer as needed in various semiconductor processes such as NAND flash application, DRAM application, or CMOS application, etc.

The method 200 starts at operation 210 by forming a sacrificial structural layer 320 on a substrate 300. The substrate may be similar to substrate 190. The sacrificial structural layer 320 may be a silicon-based material such as a silicon oxide, silicon nitride, or polysilicon. Alternatively, the sacrificial structural layer 320 may be a carbon-based material such as amorphous carbon. In cases where a carbon-based sacrificial structural layer is desired, the sacrificial structural layer 320 may be a combination of amorphous carbon and hydrogen (hydrogenated amorphous carbon film). One exemplary amorphous carbon film may be a strippable Advanced Patterning Film™ (APF) material commercially available from Applied Materials, Inc. of Santa Clara, Calif. It is contemplated that the choice of materials used for the sacrificial structural layer 320 may vary depending upon the etching/ashing rate relative to the conformal protective layer to be formed thereon. While not shown, in certain implementations where a carbon-based sacrificial structural layer is used, one or more anti-reflective coating layers may be deposited on the carbon-based sacrificial structural layer to control the reflection of light during a lithographic patterning process. Suitable anti-reflective coating layer may include silicon dioxide, silicon oxynitride, silicon nitride, or combinations thereof. One exemplary anti-reflective coating layer may be a DARC™ material commercially available from Applied Materials, Inc. of Santa Clara, Calif.

The substrate 300 may have a substantially planar surface 323 as shown. Alternatively, the substrate 300 may have patterned structures, a surface having trenches, holes, or vias formed therein. While the substrate 300 is illustrated as a single body, the substrate 300 may contain one or more materials used in forming semiconductor devices such as metal contacts, trench isolations, gates, bitlines, or any other interconnect features. In one implementation, the substrate 300 may include one or more metal layers, one or more dielectric materials, semiconductor material, and combinations thereof utilized to fabricate semiconductor devices. For example, the substrate 300 may include an oxide material, a nitride material, a polysilicon material, or the like, depending upon application. In cases where a memory application is desired, the substrate 300 may include the silicon substrate material, an oxide material, and a nitride material, with or without polysilicon sandwiched in between.

Figure 3A:
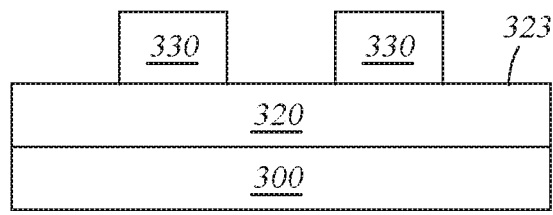
FIGS. 3A-3E are schematic side views of a structure formed according to the process flow diagram of FIG. 2.

At operation 220, a resist layer 330, such as a photoresist material, is deposited on the sacrificial structural layer 320 as shown in FIG. 3A.

Figure 3B:
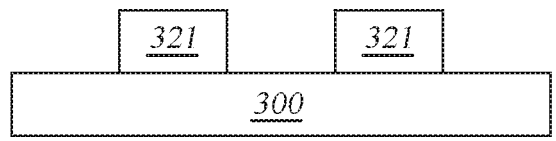

At operation 230, patterned features 321 formed from the sacrificial structural layer 320 are produced on the substrate 300 using standard photolithography and etching techniques, as shown in FIG. 3B. The patterned features may be formed from any suitable material, for example oxides, such as silicon dioxide, silicon oxynitride, or nitrides such as silicon nitride. The patterned features are sometimes referred to as placeholders, mandrels or cores and have specific linewidths and/or spacing based upon the photoresist material used. The width of the patterned features 321 may be adjusted by subjecting the resist layer 330 to a trimming process. After the pattern has been transferred into the sacrificial structural layer 320, any residual photoresist and hardmask material (if used) are removed using a suitable photoresist stripping process.

At operation 240, a plasma treatment may be performed to the sacrificial structural layer 320. Not to be bound by theory but it is believed that the plasma treatment process reduces surface roughness of the of the sacrificial structural layer 320. In one implementation, the plasma treatment is performed in the same chamber where the sacrificial structure layer is formed. In one implementation, the plasma treatment is performed in the same chamber where the amorphous silicon layer is formed. Alternatively, the plasma treatment may be performed in a different plasma process chamber.

According to one implementation of the present disclosure, the plasma treatment may be performed by positioning a substrate having the sacrificial structure layer formed thereon in a plasma process chamber, such as the plasma chamber of FIG. 1, flowing a treatment gas to the plasma process chamber and striking a plasma in the plasma process chamber. In one implementation, the treatment gas may be argon (Ar), hydrogen ($H_2$), ammonia ($NH_3$), nitrogen ($N_2$), nitrous oxide ($N_2O$), or combinations thereof. In one implementation, the plasma is a capacitively coupled plasma (CCP) or an inductively coupled plasma (ICP).

During the plasma treatment, the process chamber may be maintained at a temperature between about 100 degrees Celsius to about 500 degrees Celsius. The treatment gas may be flown to the process chamber at a flow rate between about 20 sccm to about 20,000 sccm. The chamber pressure may be between about 0.01 Torr to about 50 Torr (e.g., between about 0.1 Torr and 20 Torr). An RF power is applied to the treatment gas in the process chamber to generate plasma in the process chamber. In one implementation, the RF power may be provided between about 50 Watts and about 3,000 Watts (e.g., between about 100 Watts and about 3,000 Watts; or between about 50 Watts and about 2,000 Watts) at a frequency of about 50 kHz to about 13.6 MHz. In some implementations, the frequency is about 2 MHz, 13.56 MHz, or a mixed frequency including 2 MHz and 13.56 MHz. In some implementations, the substrate is biased during the plasma treatment process. The bias applied to the substrate may be between 0 Watts and 1,000 Watts. The plasma treatment may be performed for a duration between about 5 seconds to about 600 seconds (e.g., between about 10 seconds to about 300 seconds).

Figure 3C:
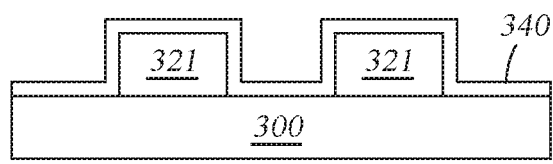

At operation 250, an amorphous silicon layer 340 is deposited conformally or substantially conformally on the patterned features 321 and the exposed surfaces of the substrate 300, as shown in FIG. 3C. The amorphous silicon layer 340 is formed according to the implementations described herein. The thickness of the amorphous silicon layer 340 may be between about 5 Å and about 200 Å.

In some implementations, conformal amorphous silicon (a-Si) deposition can be achieved by maximizing the partial pressure of the silicon precursor while minimizing the substrate temperature. Suitable silicon precursors include, but are not limited to, polysilanes ($Si_xH_y$). For example, polysilanes include disilane ($Si_2H_6$), trisilane ($Si_3H_8$), tetrasilane ($Si_4H_{10}$), isotetrasilane, neopentasilane ($Si_5H_{12}$), cyclopentasilane ($Si_5H_{10}$), hexasilane ($Si_6H_{14}$), cyclohexasilane ($Si_6H_{12}$) or, in general, $Si_xH_y$ with x=2 or more, or combinations thereof. For example, disilane, which has a moderate processing temperature and high vapor pressure, may be used as the silicon precursor, alone or in combination with other species.

In some implementations, the silicon precursor comprises substantially only disilane. As used herein, the phrase "substantially only disilane" means that at least 95% of the active species is disilane. Other gases, such as carrier gases and inert gases, can be included in this amount.

The deposited film includes an outgassable species that may evolve or outgas from the film, for example, hydrogen. The inert degas environment provides an opportunity for the gaseous species to evolve, minimizing bubbling of the final film. The inert degas environment can include any condition which allows or encourages removal of the outgassable species of the film. For example, the degas environment may consist essentially of an inert gas. As used in this regard, "consists essentially of" means that there is no gaseous species that interfere with the outgassing of the deposited film. Other reactive species may be present without inhibiting degassing of the film while still consisting essentially of an inert gas. In some implementations, the inert degas environment is an environment where there is substantially no chemical reactions occurring on the deposited film. For example, there may be substantially no chemical species that may be reactive with the deposited film. In some implementations, the degas environment does not use UV light, plasma or microwave radiation to cause degassing of the outgassable species.

In one or more implementations, the amorphous silicon film is deposited by a chemical vapor deposition process. Although similar processing chambers can be used, Chemical Vapor Deposition (CVD) processes are different from Atomic Layer Deposition (ALD). An ALD process is a self-limiting process where a single layer of material is deposited using a binary (or higher order) reaction. The process continues until all available active sites on the substrate surface have been reacted. A CVD process is not self-limiting, and a film can be grown to any predetermined thickness.

Suitable inert gases include, but are not limited to, one or more of argon, helium, nitrogen, and/or mixtures thereof. In some implementations, the inert degas environment comprises substantially no oxygen. As used in this regard, "substantially no oxygen" means that the inert degas environment has less than about 1% (on an atomic basis) oxygen atoms in the ambient conditions adjacent the substrate surface.

In one or more implementations, the outgassable species comprises hydrogen. As used in this regard, an outgassable species comprising hydrogen can include one or more of hydrogen, $SiH_2$, $SiH_3$, $SiH_4$, and/or other low-order silanes.

The pressure in the processing chamber, or region of the processing chamber can be independently controlled for the precursor exposure and degas environment. In some implementations, exposure to each of the silicon precursor and the degas environment occurs at a pressure in the range of about 50 mTorr to about 200 Torr. In some implementations, the silicon precursor is exposed to the substrate at a pressure greater than or equal to about 500 mTorr, or greater than or equal to about 1 Torr, or greater than or equal to about 5 Torr, or greater than or equal to about 10 Torr, or greater than or equal to about 20 Torr, or greater than or equal to about 30 Torr.

The temperature at which the substrate surface is exposed to the precursor or degas environment can be varied depending on, for example, the thermal budget of the device being formed and the precursor. In some implementations, exposure to each of the precursor and the degas environment occurs at a temperature in the range of about 350 degrees Celsius to about 700 degrees Celsius. In one or more implementations, the silicon halide precursor is exposed to the substrate at a temperature in the range of about 375 degrees Celsius to about 600 degrees Celsius, or in the range of about 400 degrees Celsius to about 550 degrees Celsius.

In some implementations, disilane-based conformal a-Si processes are deposited with a substrate temperature less than about 450 degrees Celsius, and disilane partial pressure is greater than or equal to about 20 Torr. In an exemplary implementation, the substrate is exposed to the silicon precursor at a pressure greater than or equal to about 20 Torr at a temperature in the range of about 400 degrees Celsius to about 550 degrees Celsius.

Figure 3D:
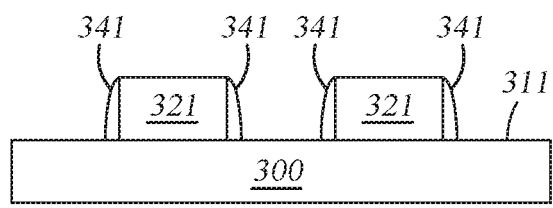

At operation 260, after the amorphous silicon layer 340 has been deposited conformally on the patterned features 321, the amorphous silicon layer 340 is anisotropically etched (a vertical etch) to expose an upper surface of the substrate 300 in areas 311 and expose an upper surface of the patterned features 321, resulting in the patterned features 321 (formed from the sacrificial structural layer 320) protected by non-sacrificial amorphous silicon-based sidewall spacers 341, as shown in FIG. 3D.

Figure 3E:
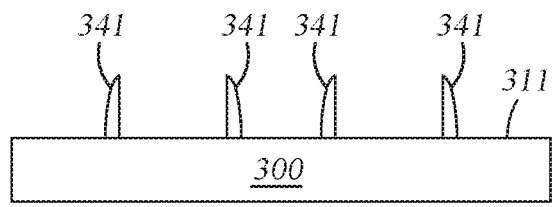

At operation 270, the patterned features 321 (formed from the sacrificial structural layer 320) are removed using a conventional plasma etching process or other suitable wet stripping process, leaving non-sacrificial amorphous silicon-based sidewall spacers 341 as shown in FIG. 3E. The plasma etching process may be done by introducing a fluorine-based etching chemistry into a plasma above the substrate. Due to the improved material quality and coverage, the non-sacrificial amorphous silicon-based sidewall spacers 341 are not damaged because they have very good selectivity to the fluorine-based reactive etching chemistry or the wet strip-based chemistry. Upon removal of the patterned features 321, the remaining non-sacrificial amorphous silicon-based sidewall spacers 341 may be used as a hardmask for etching the underlying layer, layer stack, or structure. Particularly, the density of the non-sacrificial amorphous silicon-based sidewall spacers 341 in accordance with this patterning process is twice that of the patterned features 321, the pitch of the non-sacrificial amorphous silicon-based sidewall spacers 341 is half the pitch of the patterned features 321.

The non-sacrificial amorphous silicon-based sidewall spacers 341 maybe used as a hardmask to pattern underlying material layers.

Figure 4:
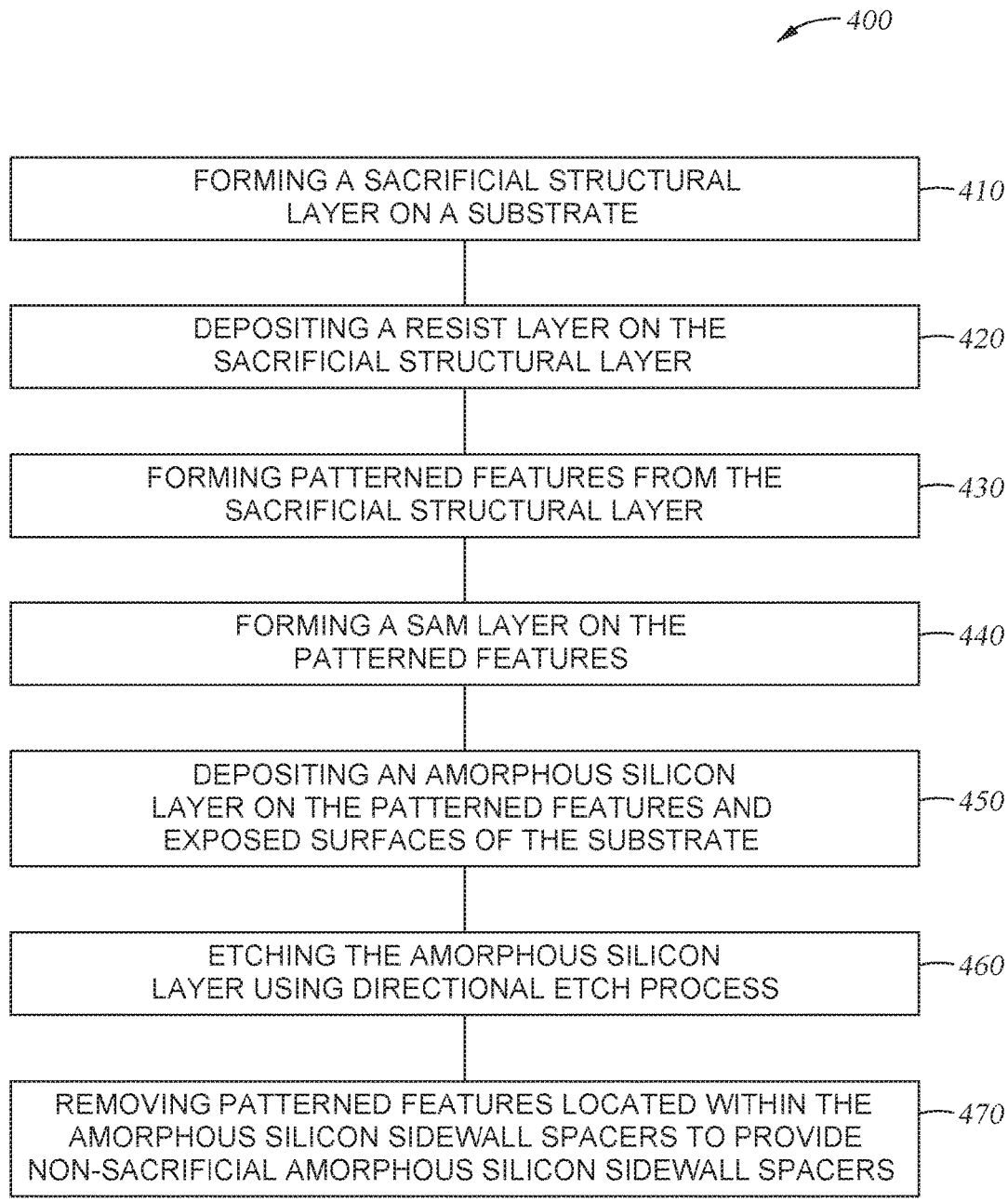
FIG. 4 is a process flow diagram depicting another implementation of a method for spacer formation according to implementations described herein.

FIG. 4 is a process flow diagram depicting another implementation of a method 400 for spacer formation according to implementations described herein. FIGS. 5A-5E are schematic side views of a structure formed according to the process flow diagram of FIG. 4. The formation process can occur with or without plasma. The deposition can occur via a thermal CVD process or a PECVD process. It is contemplated that the self-aligned double patterning process is chosen for illustration purpose. The concepts of the present disclosure is equally applicable to other processes, for example, single or dual patterning scheme, such as via/hole shrink process, self-aligned triple patterning (SATP) process, or self-aligned quadruple patterning (SAQP) process, etc. that may involve the use of protective spacers with variable line width and spacing or protective sacrificial layer as needed in various semiconductor processes such as NAND flash application, DRAM application, or CMOS application, etc.

The method 400 starts at operation 410 by forming a sacrificial structural layer 520 on a substrate 500. The substrate may be similar to substrate 190. The sacrificial structural layer 520 may be a silicon-based material such as a silicon oxide, silicon nitride, or polysilicon. Alternatively, the sacrificial structural layer 520 may be a carbon-based material such as amorphous carbon. In cases where a carbon-based sacrificial structural layer is desired, the sacrificial structural layer 520 may be a combination of amorphous carbon and hydrogen (hydrogenated amorphous carbon film). One exemplary amorphous carbon film may be a strippable Advanced Patterning Film™ (APF) material commercially available from Applied Materials, Inc. of Santa Clara, Calif. It is contemplated that the choice of materials used for the sacrificial structural layer 520 may vary depending upon the etching/ashing rate relative to the conformal protective layer to be formed thereon. While not shown, in certain implementations where a carbon-based sacrificial structural layer is used, one or more anti-reflective coating layers may be deposited on the carbon-based sacrificial structural layer to control the reflection of light during a lithographic patterning process. Suitable anti-reflective coating layer may include silicon dioxide, silicon oxynitride, silicon nitride, or combinations thereof. One exemplary anti-reflective coating layer may be a DARC™ material commercially available from Applied Materials, Inc. of Santa Clara, Calif.

The substrate 500 may have a substantially planar surface 523 as shown. Alternatively, the substrate 500 may have patterned structures, a surface having trenches, holes, or vias formed therein. While the substrate 500 is illustrated as a single body, the substrate 500 may contain one or more materials used in forming semiconductor devices such as metal contacts, trench isolations, gates, bitlines, or any other interconnect features. In one implementation, the substrate 500 may include one or more metal layers, one or more dielectric materials, semiconductor material, and combinations thereof utilized to fabricate semiconductor devices. For example, the substrate 500 may include an oxide material, a nitride material, a polysilicon material, or the like, depending upon application. In cases where a memory application is desired, the substrate 500 may include the silicon substrate material, an oxide material, and a nitride material, with or without polysilicon sandwiched in between.

Figure 5A:
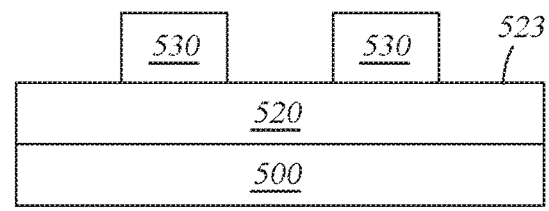
FIGS. 5A-5F are schematic side views of a structure formed according to the process flow diagram of FIG. 4.

At operation 420, a resist layer 530, such as a photoresist material, is deposited on the sacrificial structural layer 520 as shown in FIG. 5A.

Figure 5B:
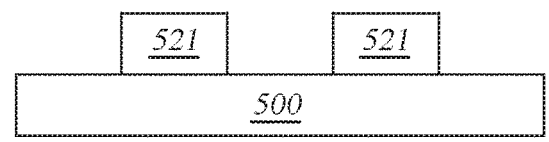

At operation 430, patterned features 521 formed from the sacrificial structural layer 520 are produced on the substrate 500 using standard photolithography and etching techniques, as shown in FIG. 5B. The patterned features may be formed from any suitable material, for example oxides, such as silicon dioxide, silicon oxynitride, or nitrides such as silicon nitride. The patterned features are sometimes referred to as placeholders, mandrels or cores and have specific linewidths and/or spacing based upon the photoresist material used. The width of the patterned features 521 may be adjusted by subjecting the resist layer 530 to a trimming process. After the pattern has been transferred into the sacrificial structural layer 520, any residual photoresist and hardmask material (if used) are removed using a suitable photoresist stripping process.

At operation 440, the substrate 500 is exposed to a SAM precursor to form a SAM 535 on the patterned features 521. Not to be bound by theory but it is believed that the SAM 535 improves adhesion of the amorphous silicon layer to the patterned features 521. It is believed that the SAM 535 helps anchor the amorphous silicon layer to the patterned features 521. Depending upon the materials used and the SAM precursors used, the SAM precursor may be a solution based precursor or a gaseous precursor. The SAM precursor may comprise the SAM molecules, precursors that form the SAM molecules, or both. The adsorbed SAM molecules form the SAM 535.

The SAM 535 comprises an organized layer of the SAM molecules, which may be amphiphilic, in which one end of the molecule, the head group shows a specific, reversible affinity for the silicon oxide material that forms the patterned features 521. The head group is typically connected to an alkyl chain in which a terminal end "R" can be functionalized. The SAM 535 is formed by chemisorption of the head group onto the patterned features 521, followed by two-dimensional organization of the hydrophobic tail groups. SAM adsorption can occur from solution by immersion of the substrate 500 into a dilute solution containing the SAM molecules. In one implementation, the SAM 535 is deposited via spin coating from a solution. SAM adsorption can also occur from vapor deposition by exposing the substrate 500 to a gaseous precursor. The thickness of the SAM 535 can be adjusted by adjusting the carbon chain length of the alkyl chain of the SAM molecule. Generally, the SAM 535 may only be formed on the surface that has chemical reaction capability with the SAM molecules.

Figure 5C:
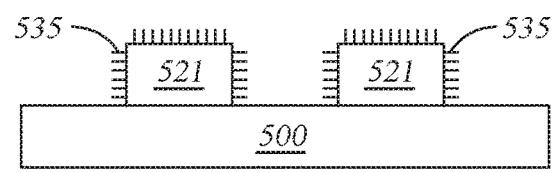

In the implementations depicted in FIG. 5C, the SAM precursor utilized to form the SAM 535 is selected to only chemically react with the exposed surface of the patterned features 521, (e.g., a silicon oxide material) and the exposed surface of the subsequently deposited amorphous silicon layer. By doing so, the SAM 535 may be predominantly formed on the exposed surface of the patterned features 521.

Examples of SAM materials, which may be utilized, include the materials described hereinafter, including combinations, mixtures, and grafts thereof, in addition to other SAM materials having characteristics suitable for blocking deposition of subsequently deposited materials in a semiconductor fabrication process. In one implementation, the SAM materials may be carboxylic acid materials, such as methylcarboxylic acids, ethylcarboxylic acids, propylcarboxylic acids, butylcarboxylic acids, pentylcarboxylic acids, hexylcarboxylic acids, heptylcarboxylic acids, octylcarboxylic acids, nonylcarboxylic acids, decylcarboxylic acids, undecylcarboxylic acids, dodecylcarboxylic acids, tridecylcarboxylic acids, tetradecylcarboxylic acids, pentadecylcarboxylic acids, hexadecylcarboxylic acids, heptadecylcarboxylic acids, octadecylcarboxylic acids, and nonadecylcarboxylic acids.

In another implementation, the SAM materials may be phosphonic acid materials, such as methylphosphonic acid, ethylphosphonic acid, propylphosphonic acid, butylphosphonic acid, pentylphosphonic acid, hexylphosphonic acid, heptylphosphonic acid, octylphosphonic acid, nonylphosphonic acid, decylphosphonic acid, undecylphosphonic acid, dodecylphosphonic acid, tridecylphosphonic acid, tetradecylphosphonic acid, pentadecylphosphonic acid, hexadecylphosphonic acid, heptadecylphosphonic acid, octadecylphosphonic acid, and nonadecylphosphonic acid.

In another implementation, the SAM materials may be thiol materials, such as methanethiol, ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, and nonadecanethiol.

In another implementation, the SAM materials may be silylamine materials, such as tris(dimethylamino)methylsilane, tris(dimethylamino)ethylsilane, tris(dimethylamino)propylsilane, tris(dimethylamino)butylsilane, tris(dimethylamino)pentylsilane, tris(dimethylamino)hexylsilane, tris(dimethylamino)heptylsilane, tris(dimethylamino)octylsilane, tris(dimethylamino)nonylsilane, tris(dimethylamino)decylsilane, tris(dimethylamino)undecylsilane tris(dimethylamino)dodecylsilane, tris(dimethylamino)tridecylsilane, tris(dimethylamino)tetradecylsilane, tris(dimethylamino)pentadecylsilane, tris(dimethylamino)hexadecylsilane, tris(dimethylamino)heptadecylsilane, tris(dimethylamino)octadecylsilane, and tris(dimethylamino)nonadecylsilane.

In another implementation, the SAM materials may be chlorosilane materials, such as methyltrichlorosilane, ethyltrichlorosilane, propyltrichlorosilane, butyltrichlorosilane, pentyltrichlorosilane, hexyltrichlorosilane, heptyltrichlorosilane, octyltrichlorosilane, nonyltrichlorosilane, decyltrichlorosilane, undecyltrichlorosilane, dodecyltrichlorosilane, tridecyltrichlorosilane, tetradecyltrichlorosilane, pentadecyltrichlorosilane, hexadecyltrichlorosilane, heptadecyltrichlorosilane, octadecyltrichlorosilane, and nonadecyltrichlorosilane.

In another implementation, the SAM materials may be oxysilane materials, such as methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, hexyltrimethoxysilane, hexyltriethoxysilane, heptyltrimethoxysilane, heptyltriethoxysilane, octyltrimethoxysilane, octyltriethoxysilane, nonyltrimethoxysilane, nonyltriethoxysilane, decyltrimethoxysilane, decyltriethoxysilane, undecyltrimethoxysilane, undecyltriethoxysilane, dodecyltrimethoxysilane, dodecyltriethoxysilane, tridecyltrimethoxysilane, tridecyltriethoxysilane, tetradecyltrimethoxysilane, tetradecyltriethoxysilane, pentadecyltrimethoxysilane, pentadecyltriethoxysilane, hexadecyltrimethoxysilane, hexadecyltriethoxysilane, heptadecyltrimethoxysilane, heptadecyltriethoxysilane, octadecyltrimethoxylsilane, octadecyltriethoxysilane, nonadecyltrimethoxysilane, and nonadecyltriethoxysilane.

In another implementation, the SAM materials may have a fluorinated R group, such as (1,1,2,2-perfluorodecyl)

trichlorosilane, trichloro(1,1,2,2-perfluorooctyl)silane, (trideca-fluoro-1,1,2,2-tetrahydrooctyl)trichlorosilane, (tridecafluoro-1,1,2,2-tetrahydro-octyl)triethoxysilane, (tridecafluoro-1,1,2,2-tetrahydrooctyl)methyldichlorosilane, (tridecafluoro-1,1,2,2-tetrahydrooctyl)dimethylchlorosilane, and (heptadecafluoro-1,1,2,2-tetrahydrodecyl)trichlorosilane, among others. It is contemplated that combinations and mixtures of the aforementioned materials are within the scope of this disclosure.

SAM adsorption can occur from solution by immersion of the substrate 500 into a dilute solution containing the SAM molecules. In one implementation, the SAM 535 is deposited via spin coating from a solution. SAM adsorption can also occur from vapor deposition by exposing the substrate 500 to a gaseous precursor. The thickness of the SAM 535 can be adjusted by adjusting the carbon chain length of the alkyl chain of the SAM molecule. Generally, the SAM 535 may be formed on the surface that has chemical reaction capability with the SAM molecules.

In one implementation, the SAM adsorption may be a vapor phase deposition process. In this implementation, SAM molecules may be vaporized in an ampoule maintained at a temperature between about 25 degrees Celsius and about 300 degrees Celsius, such as between about 125 degrees Celsius and about 200 degrees Celsius. The substrate 500 may be maintained at a temperature of between about 25 degrees Celsius and about 400 degrees Celsius, such as between about 50 degrees Celsius and about 200 degrees Celsius, for example, between about 100 degrees Celsius and about 175 degrees Celsius. A pressure of the substrate-processing environment, such as the processing volume of a processing chamber, may be maintained at a pressure of between about 1 mT and about 1520 T, such as between about 5 T and about 600 T. A carrier gas may be utilized to facilitate delivery of vapor phase SAM molecules and the carrier gas, depending on the volume of the processing chamber, may be delivered at a flow rate of between about 25 sccm and about 3000 sccm, such as between about 50 sccm and about 1000 sccm. Suitable carrier gases include gases, such as noble gases or the like, that are generally inert under SAM adsorption conditions that facilitate delivery of the SAM molecules to the substrate surfaces. The SAM molecules may be exposed to the substrate 500 in operation 440 for an amount of time between about 1 second and about 48 hours, for example, between about 1 minute and about 120 minutes.

Figure 5D:
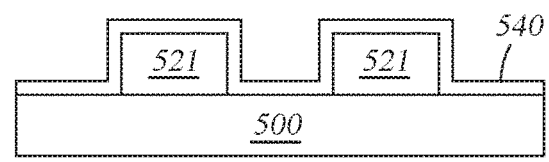

At operation 450, an amorphous silicon layer 540 is deposited conformally or substantially conformally on the patterned features 521 and the exposed surfaces of the substrate 500, as shown in FIG. 5D. The amorphous silicon layer 540 is formed according to the implementations described herein. The thickness of the amorphous silicon layer 540 may be between about 5 Å and about 200 Å.

In some implementations, conformal amorphous silicon (a-Si) deposition can be achieved by maximizing the partial pressure of the silicon precursor while minimizing the substrate temperature. Suitable silicon precursors include, but are not limited to, poly-silanes ($Si_xH_y$). For example, poly-silanes include disilane ($Si_2H_6$), trisilane ($Si_3H_5$), tetrasilane ($Si_4H_{10}$), isotetrasilane, neopentasilane ($Si_6H_{12}$), cyclopentasilane ($Si_5H_{10}$), hexasilane ($C_6H_{14}$), cyclohexasilane ($Si_6H_{12}$) or, in general, $Si_xH_y$ with x=2 or more, or combinations thereof. For example, disilane, which has a moderate processing temperature and high vapor pressure, may be used as the silicon precursor, alone or in combination with other species.

In some implementations, the silicon precursor comprises substantially only disilane. As used herein, the phrase "substantially only disilane" means that at least 95% of the active species is disilane. Other gases, such as carrier gases and inert gases, can be included in this amount.

The deposited film includes an outgassable species that may evolve or outgas from the film, for example, hydrogen. The inert degas environment provides an opportunity for the gaseous species to evolve, minimizing bubbling of the final film. The inert degas environment can include any condition which allows or encourages removal of the outgassable species of the film. For example, the degas environment may consist essentially of an inert gas. As used in this regard, "consists essentially of" means that there is no gaseous species that interfere with the outgassing of the deposited film. Other reactive species may be present without inhibiting degassing of the film while still consisting essentially of an inert gas. In some implementations, the inert degas environment is an environment where there is substantially no chemical reactions occurring on the deposited film. For example, there may be substantially no chemical species that may be reactive with the deposited film. In some implementations, the degas environment does not use UV light, plasma or microwave radiation to cause degassing of the outgassable species.

In one or more implementations, the amorphous silicon film is deposited by a chemical vapor deposition process. Although similar processing chambers can be used, Chemical Vapor Deposition (CVD) processes are different from Atomic Layer Deposition (ALD). An ALD process is a self-limiting process where a single layer of material is deposited using a binary (or higher order) reaction. The process continues until all available active sites on the substrate surface have been reacted. A CVD process is not self-limiting, and a film can be grown to any predetermined thickness.

Suitable inert gases include, but are not limited to, one or more of argon, helium, nitrogen, and/or mixtures thereof. In some implementations, the inert degas environment comprises substantially no oxygen. As used in this regard, "substantially no oxygen" means that the inert degas environment has less than about 1% (on an atomic basis) oxygen atoms in the ambient conditions adjacent the substrate surface.

In one or more implementations, the outgassable species comprises hydrogen. As used in this regard, an outgassable species comprising hydrogen can include one or more of hydrogen, $SiH_2$, $SiH_3$, $SiH_4$, and/or other low-order silanes.

The pressure in the processing chamber, or region of the processing chamber can be independently controlled for the precursor exposure and degas environment. In some implementations, exposure to each of the silicon precursor and the degas environment occurs at a pressure in the range of about 50 mTorr to about 200 Torr. In some implementations, the silicon precursor is exposed to the substrate at a pressure greater than or equal to about 500 mTorr, or greater than or equal to about 1 Torr, or greater than or equal to about 5 Torr, or greater than or equal to about 10 Torr, or greater than or equal to about 20 Torr, or greater than or equal to about 30 Torr.

The temperature at which the substrate surface is exposed to the precursor or degas environment can be varied depending on, for example, the thermal budget of the device being formed and the precursor. In some implementations, exposure to each of the precursor and the degas environment occurs at a temperature in the range of about 350 degrees Celsius to about 700 degrees Celsius. In one or more implementations, the silicon halide precursor is exposed to the substrate at a temperature in the range of about 375 degrees Celsius to about 600 degrees Celsius, or in the range of about 400 degrees Celsius to about 550 degrees Celsius.

In some implementations, disilane-based conformal a-Si processes are deposited with a substrate temperature less than about 450 degrees Celsius, and disilane partial pressure is greater than or equal to about 20 Torr. In an exemplary implementation, the substrate is exposed to the silicon precursor at a pressure greater than or equal to about 20 Torr at a temperature in the range of about 400 degrees Celsius to about 550 degrees Celsius.

Figure 5E:
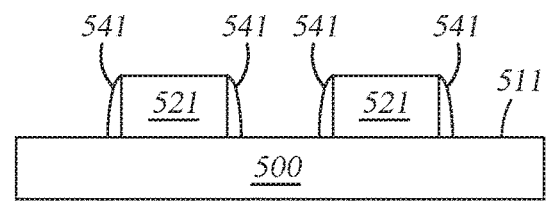

At operation 460, after the amorphous silicon layer 540 has been deposited conformally on the patterned features 521, the amorphous silicon layer 540 is anisotropically etched (a vertical etch) to expose an upper surface of the substrate 500 in areas 511 and expose an upper surface of the patterned features 521, resulting in the patterned features 521 (formed from the sacrificial structural layer 520) protected by non-sacrificial amorphous silicon-based sidewall spacers 541, as shown in FIG. 5E.

Figure 5F:
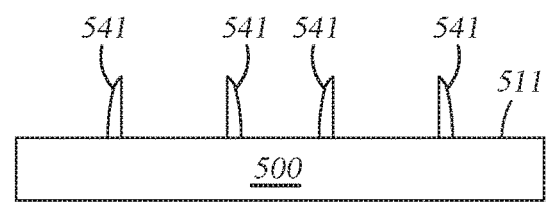

At operation 470, the patterned features 521 (formed from the sacrificial structural layer 520) are removed using a conventional plasma etching process or other suitable wet stripping process, leaving the non-sacrificial amorphous silicon-based sidewall spacers 541 as shown in FIG. 5F. The plasma etching process may be done by introducing a fluorine-based etching chemistry into a plasma above the substrate. Due to the improved material quality and coverage, the non-sacrificial amorphous silicon-based sidewall spacers 541 are not damaged because they have very good selectivity to the fluorine-based reactive etching chemistry or the wet strip-based chemistry. Upon removal of the patterned features 521, the remaining non-sacrificial amorphous silicon-based sidewall spacers 541 may be used as a hardmask for etching the underlying layer, layer stack, or structure. Particularly, the density of the non-sacrificial amorphous silicon-based sidewall spacers 541 in accordance with this patterning process is twice that of the photolithographically patterned features 521, the pitch of the non-sacrificial amorphous silicon-based sidewall spacers 541 is half the pitch of the patterned features 521. The non-sacrificial amorphous silicon-based sidewall spacers 541 maybe used as a hardmask to pattern underlying material layers.

Figure 6:
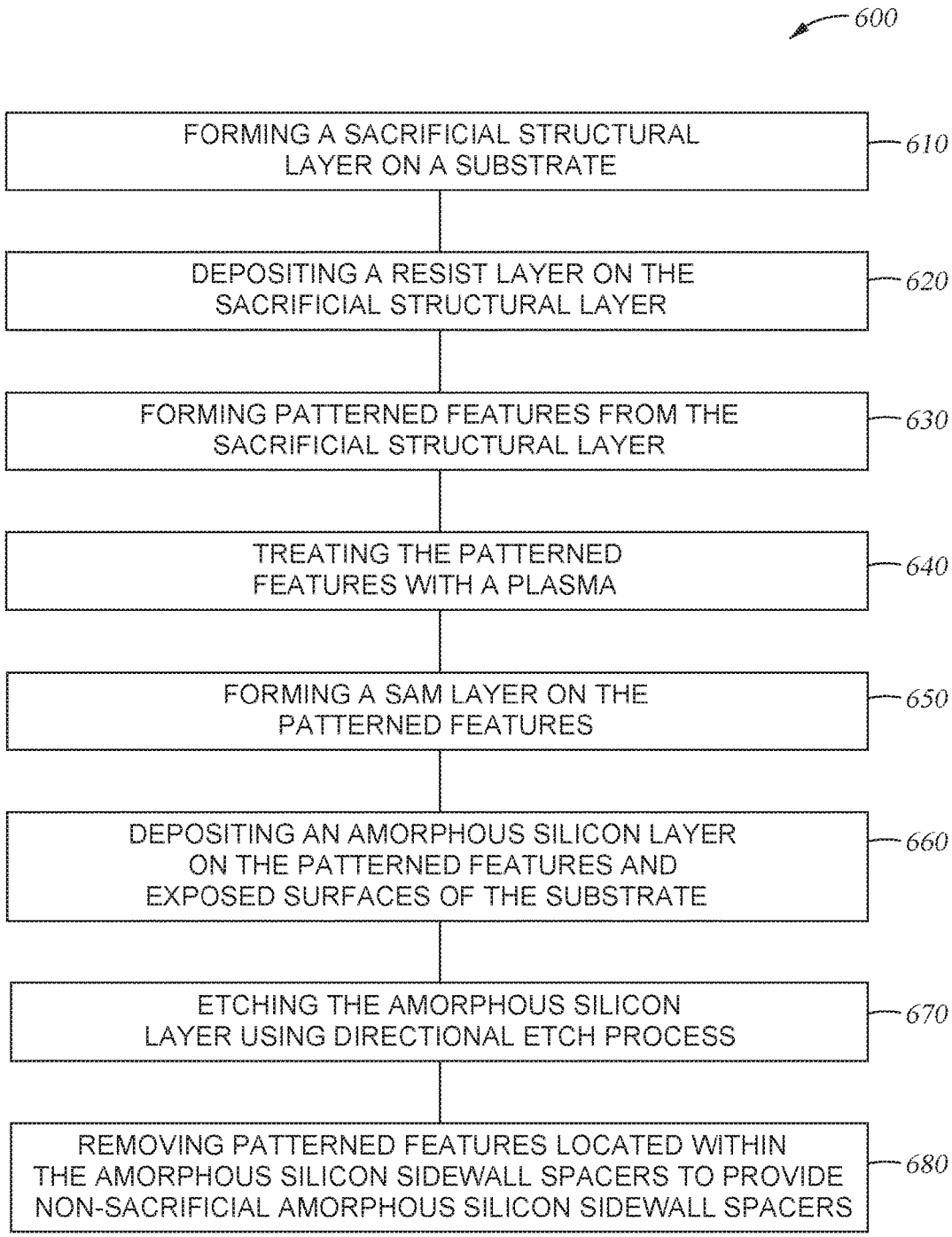
FIG. 6 is a process flow diagram depicting another implementation of a method for spacer formation according to implementations described herein.

FIG. 6 is a process flow diagram depicting another implementation of a method 600 for spacer formation according to implementations described herein. The method 600 is similar to method 200 and method 400 except that method 600 incorporates both the plasma treatment process of method 400 and the SAM formation of method 400. At operation 610, a sacrificial structural layer is formed on a substrate, similar to operation 210 and operation 410. At operation 620, a resist layer is formed on the sacrificial structural layer, similar to operation 220 and operation 420. At operation 630, patterned features are formed from the sacrificial structural layer, similar to operation 230 and operation 430. At operation 640, the patterned features are treated with plasma, similar to operation 240. At operation 650, a SAM is formed on the patterned features, similar to operation 440. At operation 660, an amorphous silicon layer is formed on the patterned features and exposed surfaces of the substrate, similar to operation 250 and operation 450. At operation 670, the amorphous silicon layer is etched using a directional etch process, similar to operation 260 and operation 460. At operation 680, the patterned features located within the amorphous silicon sidewall spacers to provide non-sacrificial amorphous silicon sidewall spacers.

In summary, some implementations of the present disclosure provide improved methods for amorphous silicon spacer formation. Some of the improved methods described herein provide for high conformality, low pattern loading and BEOL compatible processing temperatures. Some of the improved methods described herein further provide for reduced roughness of an underlying oxide film and improved adhesion with a subsequently deposited amorphous silicon film. In some implementations, the underlying oxide film is exposed to a plasma treatment, which reduces the roughness of the subsequently deposited amorphous silicon film as well as improve the adhesion between the underlying oxide film and the amorphous silicon film. In some implementations, a SAM is formed on the underlying oxide layer to improve adhesion with the subsequently deposited amorphous silicon layer.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the present disclosure may be devised without departing from the basic scope thereof, and the scope thereof is determined by the claims that follow.

The invention claimed is:

1. A method of forming an amorphous silicon layer on a substrate in a processing chamber, comprising:
    depositing a predetermined thickness of a sacrificial dielectric layer over a substrate;
    forming patterned features on the substrate by removing portions of the sacrificial dielectric layer to expose an upper surface of the substrate;
    performing a plasma treatment to the patterned features;
    depositing an amorphous silicon layer on the patterned features and the exposed upper surface of the substrate; and
    selectively removing the amorphous silicon layer from an upper surface of the patterned features and the upper surface of the substrate using an anisotropic etching process to provide the patterned features filled within sidewall spacers formed from the amorphous silicon layer.

2. The method of claim 1, wherein performing the plasma treatment comprises:
    flowing a treatment gas into the processing chamber; and
    generating a plasma in the processing chamber to treat the patterned features of the substrate.

3. The method of claim 2, wherein the treatment gas comprises argon.

4. The method of claim 2, wherein the treatment gas comprises one of argon, hydrogen, nitrogen, nitrous oxide, ammonia, and combinations thereof.

5. The method of claim 1, wherein performing the plasma treatment to the patterned features and depositing the amorphous silicon layer on the patterned features and the exposed upper surface of the substrate are performed in the same processing chamber.

6. The method of claim 1, wherein the sacrificial dielectric layer comprises silicon oxide.

7. The method of claim 1, wherein depositing the amorphous silicon layer on the patterned features and the exposed upper surface of the substrate comprises exposing the patterned features to a silicon precursor to form an amorphous silicon film having an outgassable species comprising hydrogen.

8. The method of claim 7, further comprising exposing the amorphous silicon film to an inert degas environment to remove the outgassable species from the amorphous silicon film to form a degassed amorphous silicon film.

9. The method of claim 8, wherein the silicon precursor comprises one or more of disilane, trisilane, tetrasilane, isotetrasilane, neopentasilane, cyclopentasilane, hexasilane, cyclohexasilane, and combinations thereof.

10. The method of claim 9, wherein the silicon precursor is disilane.

11. The method of claim 8, wherein the inert degas environment consists essentially of an inert gas.

12. The method of claim 11, wherein the inert gas comprises one or more of argon, helium, and nitrogen.

13. The method of claim 12, wherein exposure to each of the silicon precursor and the inert degas environment occurs at a pressure in a range of about 50 mTorr to about 200 Torr.

14. The method of claim 13, wherein exposure to each of the silicon precursor and the inert degas environment occurs at a temperature in a range of about 350 degrees Celsius to about 700 degrees Celsius.

15. The method of claim 14, wherein each exposure to the silicon precursor and the inert degas environment grows the degassed amorphous silicon film with a thickness in a range of about 5 Å to about 20 Å.

16. The method of claim 14, wherein the degassed amorphous silicon film has a thickness in a range of about 100 Å to about 1 μm.

17. The method of claim 16, further comprising removing the patterned features from the substrate.

18. The method of claim 17, wherein depositing the amorphous silicon layer on the patterned features and the exposed upper surface of the substrate is performed using a thermal chemical vapor deposition process.

19. A method of forming an amorphous silicon layer on a substrate in a processing chamber, comprising:
   depositing a predetermined thickness of a sacrificial dielectric layer over a substrate;
   forming patterned features on the substrate by removing portions of the sacrificial dielectric layer to expose an upper surface of the substrate;
   forming a self-assembled monolayer ("SAM") on the patterned features;
   depositing an amorphous silicon layer on the SAM and the exposed upper surface of the substrate; and
   selectively removing the amorphous silicon layer from an upper surface of the patterned features and the upper surface of the substrate using an anisotropic etching process to provide the patterned features filled within sidewall spacers formed from the amorphous silicon layer.

20. A method of forming an amorphous silicon layer on a substrate in a processing chamber, comprising:
   depositing a predetermined thickness of a sacrificial dielectric layer over a substrate;
   forming patterned features on the substrate by removing portions of the sacrificial dielectric layer to expose an upper surface of the substrate;
   performing a plasma treatment to the patterned features;
   forming a self-assembled monolayer ("SAM") on the plasma treated patterned features;
   depositing an amorphous silicon layer on the SAM and the exposed upper surface of the substrate; and
   selectively removing the amorphous silicon layer from an upper surface of the patterned features and the upper surface of the substrate using an anisotropic etching process to provide the patterned features filled within sidewall spacers formed from the amorphous silicon layer.

* * * * *

UNITED STATES PATENT AND TRADEMARK OFFICE
CERTIFICATE OF CORRECTION

PATENT NO. : 10,276,379 B2  
APPLICATION NO. : 15/925976  
DATED : April 30, 2019  
INVENTOR(S) : Rui Cheng et al.

Page 1 of 1

It is certified that error appears in the above-identified patent and that said Letters Patent is hereby corrected as shown below:

In the Specification

Column 7, Line 32, delete "of the of the" and insert -- of the --, therefor.

Column 8, Line 19, delete "$(Si_6H_{12})$," and insert -- $(Si_5H_{12})$, --, therefor.

Column 10, Line 2, delete "maybe" and insert -- may be --, therefor.

Column 13, Line 61, delete "$(Si_6H_{12})$," and insert -- $(Si_5H_{12})$, --, therefor.

Column 15, Line 45, delete "maybe" and insert -- may be --, therefor.

Signed and Sealed this  
Second Day of July, 2019

Andrei Iancu  
*Director of the United States Patent and Trademark Office*